(12) United States Patent
Zarnowski et al.

(10) Patent No.: US 6,194,770 B1
(45) Date of Patent: Feb. 27, 2001

(54) PHOTO RECEPTOR WITH REDUCED NOISE

(75) Inventors: Jeffrey J. Zarnowski, McGraw; Matthew A. Pace, Cortland, both of NY (US)

(73) Assignee: Photon Vision Systems LLC, Cortland, NY (US)

( * ) Notice: Subject to any disclaimer, the term of this patent is extended or adjusted under 35 U.S.C. 154(b) by 0 days.

(21) Appl. No.: 09/039,833

(22) Filed: Mar. 16, 1998

(51) Int. Cl.$^7$ ................................................. H01L 31/0232
(52) U.S. Cl. ...................... 257/436; 257/448; 250/214 R; 250/214.1
(58) Field of Search ...................... 257/436, 448; 250/214 R, 214.1

(56) References Cited

U.S. PATENT DOCUMENTS

| | | | |
|---|---|---|---|
| 5,283,428 | * 2/1994 | Morishita et al. | 250/214.1 |
| 5,471,515 | 11/1995 | Fossum et al. | 377/60 |
| 5,502,488 | 3/1996 | Nagasaki | 348/300 |

FOREIGN PATENT DOCUMENTS

| | | |
|---|---|---|
| 0714134 | 5/1999 | (EP) . |
| 62-269354 | 11/1887 | (JP) . |
| 57-26971 | * 2/1982 | (JP) . |
| 63-155759 | 6/1988 | (JP) . |

* cited by examiner

Primary Examiner—Mahshid Saadat
Assistant Examiner—George C. Eckert, II
(74) Attorney, Agent, or Firm—Harter Secrest & Emery LLP; Stephen B. Salai, Esq.; Joseph M. Young, Esq.

(57) ABSTRACT

An improved low voltage, small surface area, high signal-to-noise ratio photo gate includes a layer of photoreceptive semiconductor material having an impurity concentration selected to enhance the formation of hole electron pairs in response to photons impinging on a surface of the substrate, an electrode extending from the surface of the substrate into the substrate a substantial distance; an insulating layer disposed between the electrode and the substrate for electrically insulating the electrode from the substrate; so that upon the application of an electrical potential to the electrode, a potential well is formed in the substrate surrounding the electrode for accumulating charge generated when photons impinge on the surface of the substrate surrounding the electrode.

3 Claims, 2 Drawing Sheets

KEY
- Poly 1
- Poly 2
- Metal 1
- Metal 2
- Contact/Via
- Trench Capacitor

PHOTO RECEPTOR WITH REDUCED NOISE

This invention relates generally to photo receptors, and more particularly to a photo receptor for imaging applications that exhibits a higher signal to noise ratio than photo receptors heretofore known.

Semiconductor photo detectors (photo gates) for quantifying the charge created by incident radiation generally are well known.

Photogate structures include: Active Pixels, Charge Couple Devices (CCD), Charge Injection Devices (CID) and their variants that include virtual phase, buried channel and other variations that utilize selective dopants. The selective dopants are used to control charge collection and transfer underneath and between the photogate(s) and the sense node.

Such photo detectors utilize the phenomenon by which free electrons are generated by the interaction of photons with semiconductor materials, such as silicon. In known imaging photo detectors, a variety of techniques have been employed to form a potential well for accumulating a charge created by photons impinging on the surface of the semiconductor device above the well. In a particularly useful device, a photon transmissive electrode is formed on an insulating layer on the surface of the device, so that when a potential is applied to the electrode, a potential well is formed in the semiconductor layer beneath the electrode by the depletion of majority or minority charge carriers within the region. Free electrons generated by photons impinging upon the surface of the device, and passing through the electrode, are accumulated in the well. The magnitude of the accumulated charge can subsequently be sensed either directly or by transferring the charge to a sensor region where the magnitude of the charge can be measured.

Another form of photo detector uses an implanted region of opposite conductivity type from the substrate to form a potential well without the need for an electrode overlying the photoreceptive area. This type of construction, referred to as photo diode construction, is more sensitive to certain wavelengths than the photo gate construction just described, but may exhibit lower signal to noise ratios.

One of the primary characteristics of importance for an imager is the dynamic range. The dynamic range is typically defined as the charge in a full well of the pixel to the root means square (rms) of the noise. Full well of a pixel is the total amount of carriers, electrons or holes, that a pixel will hold. In the case of a photogate, it historically has been directly related to the top surface area of the MOS capacitor that forms the photogate and to the applied bias that creates the potential well to collect the carriers.

Standardization of imager processing and shrinking feature sizes have resulted in lowered operating biases. Since, photogate structures are Metal Oxide Semiconductor (MOS) capacitors, the amount of charge a photogate can hold is dependent on the area of the gate electrode, referred to as the top plate, that is typically made of polysilicon, and the total bias applied across the insulator. The lowered operating biases for photogates have lowered their full well correspondingly. Also, the drive toward smaller and smaller pixels for higher resolution has further reduced the surface area available and therefore the amount of charge that can be collected.

It is a problem of both photo diodes and photo gates that the signal to noise ratio is often less than optimum, the dynamic range of the device may be less than required for a particular application, and the size of the device required to obtain the necessary sensitivity may reduce the resolution of the device, that is the number of pixels that can be formed in a given area, to a lower than required number.

There is a need for photoreceptors that are, at the same time, smaller than existing constructions, exhibit greater dynamic range, and exhibit higher signal to noise ratios than those heretofore known.

The location (depth) at which free electron hole pairs are generated by photons impinging on the surface of a photoreceptor depends on the wavelength of the photons. Longer wavelengths tend to generate charge further from the surface of the device than shorter wavelengths. Therefore, it is difficult to design a photoreceptor that exhibits an even approximately linear sensitivity to light over a useful color range. Shorter wavelengths are attenuated more strongly as they pass through even largely transparent materials, such as polysilicone materials, while longer wavelengths generate free electrons at distances from the surface that may be beyond the bottom of the potential well and which therefore will usually recombine before they can be sensed.

While higher voltages can be used to form deeper potential wells, there is a demand for semiconductor devices including imagers that operate at lower rather than higher voltages and therefore it is not feasible to increase the voltage on the device in many applications.

The signal to noise ratio of a photoreceptor is generally proportional to the ratio of the surface area of the photoreceptor, that is the area of the surface of the layer on which the photoreceptor is formed that is occupied by the photoreceptor, to the total volume of the photoreceptor. Since the volume of a conventional photoreceptor increases with the cube of the linear dimension thereof, while the surface area increases with the square thereof, large photosensors exhibit a higher signal to noise ratio than small sensors. However, small sensors are desirable for achieving high resolutions. Heretofore, signal to noise ratio has placed a limit on the degree to which the size of photosensors can be reduced that is far more significant than any limitations created by process geometries or the like.

It is an object of this invention to provide a construction for a photoreceptor that overcomes one or more of the problems just mentioned.

It is another object of this invention to provide a photoreceptor that can create a potential well for accumulating a charge generated by photons impinging on the detector, which well is deeper than has heretofore been possible without the need for applying higher voltages to create the well.

It is another object of this invention to provide a photoreceptor construction that simultaneously reduces the surface area of the photoreceptor and increases the volume thereof to produce a higher signal to noise ratio.

It is another object of this invention to provide a photosensitive imager that permits a substantially higher density of picture elements (pixels) to be formed in a given area than has heretofore been possible, while at the same time providing higher signal to noise ratios and greater dynamic range than are achievable with known constructions.

Briefly stated, and in accordance with a presently preferred embodiment of the invention, an improved low voltage, small surface area, high signal-to-noise ratio photo gate includes a layer of photoreceptive semiconductor material having an impurity concentration selected to enhance the formation of hole electron pairs in response to photons impinging on a surface of the substrate, an electrode extending from the surface of the substrate into the substrate a substantial distance; an insulating layer disposed between the electrode and the substrate for electrically insulating the electrode from the substrate; so that upon the application of an electrical potential to the electrode, a potential well is formed in the substrate surrounding the electrode for accumulating charge generated when photons impinge on the surface of the substrate surrounding the electrode.

In accordance with another aspect of this invention, a photo gate in accordance with the invention comprises a charge sensor disposed in the substrate adjacent the electrode.

In accordance with another aspect of the invention, the electrode comprises a photo opaque metal electrode.

In accordance with another aspect of the invention, the electrode comprises a phototransmissive electrode.

In accordance with still another aspect of the invention, a photo gate comprises a plurality of electrodes extending from the surface of a photoresponsive site into the bulk of a substrate and means for electrically connecting the electrodes at the surface.

In accordance with still another aspect of the invention, a photo gate comprises a plurality of electrodes, arranged in an array, of at least two by two electrodes, all extending from the surface of the semiconductor body into the bulk thereof, and electrically connected at the surface.

BRIEF DESCRIPTION OF THE DRAWINGS

While the novel aspects of the invention are set forth with particularity in the appended claims, the invention itself, together with further aspects and advantages thereof, may be more readily comprehended by reference to the following detailed description of a presently preferred embodiment of the invention taken in conjunction with the accompanying drawings, in which:

DETAILED DESCRIPTION OF A PREFERRED EMBODIMENT OF THE INVENTION

Figure 1:
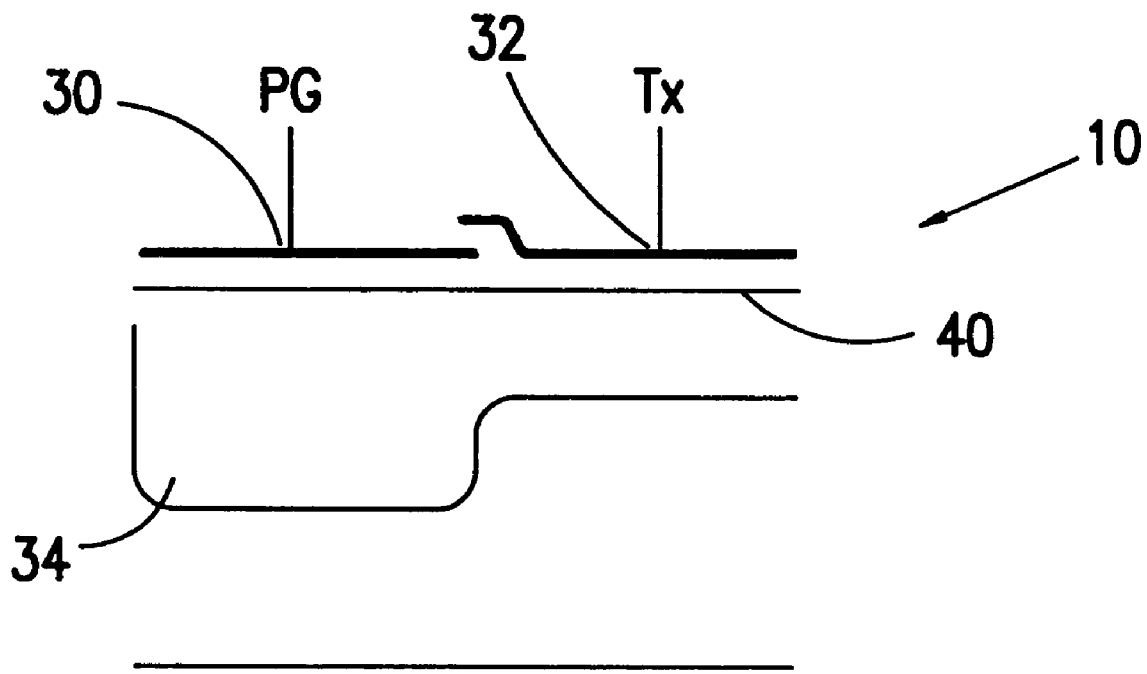
FIG. 1 is a diagrammatic view of a photo gate in accordance with the prior art.

FIG. 1 is a cross sectional view of one photogate pixel 10 that could be utilized directly as a passive type of imager such as a Charge Injection Device (CID) or Charge Coupled Device (CCD) or joined to selection circuitry and a source follower or a differential pair in an active pixel or active column sensor. First and second top plates 30, 32 are preferably formed of polysilicon; top plate 30 is preferably formed from light transmissive polysilicon.

The operation of a photogate pixel 10 is as follows:
1. Two polysilicon MOS capacitor top plates 30, 32 are physically adjacent to one another and are coupled together either by overlapping silicon at adjacent edges as in FIG. 1 or through an implant in the underlying substrate (not shown).
2. First photogate 30 is used to collect photon generated charge, by applying a greater potential on it than to the photogate 32 used for sensing. The greater bias creates a depleted region or well 34 in the underlying substrate and attracts the photon generated charge underneath it.
3. The other photogate 32 has a lower potential on it, to form a shallower depleted region 40 and the photon generated carriers aren't collected. The photogate 32 is then isolated so that it is floating. After the desired integration time has elapsed, the potential on the photogate 30 used to collect photon generated charge, is removed and the collected charge, that exists in the underlying substrate, is then coupled to the substrate under the other photogate 32. Since, the photogate 32, a MOS capacitor top plate is floating, the transfer of charge from photogate 30 causes voltage on the photogate 32 to shift according to the amount of charge transferred.
4. The new value of the top plate 32 is measured and the difference from its original bias value represents the amount of incident photons collected at the pixel.

Top plate 32 could be the sense node as described above for a passive pixel or a transfer gate for an active pixel or column sensor.

Figure 2:
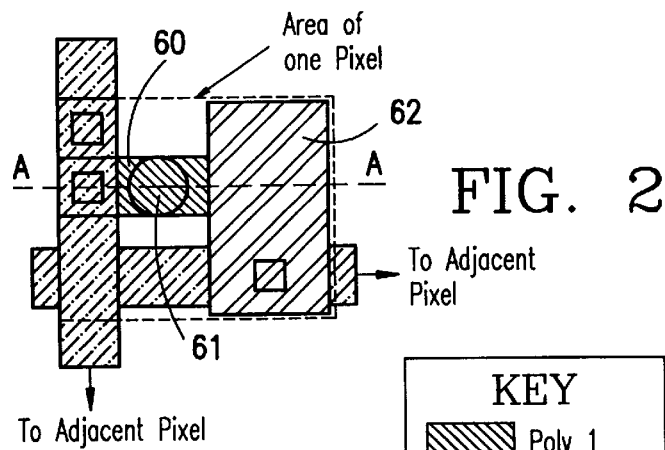
FIG. 2 is a diagram of a photogate in accordance with this invention.

FIG. 2 shows a pixel 20 similar to the pixel shown in FIG. 1 with an added trench capacitor according to the invention. It can be seen from the cross sectional view how electrode 61 which depends from the top plate 60 has increased the overall volume of potential well 64, without increasing the top surface area to improve the capacitance of the pixel 20. The trench capacitor is formed by etching a hole 63 in the substrate 68 and forming an insulator layer 66 on the upper surface of the substrate and the inside surface of hole 63. The remainder of hole 63 is filled with a conductive material such as polysilicon or metal and is electronically connected to the top plate 60. Top plate 62 may also form a trench capacitor as shown in FIG. 4.

The trench capacitor 60 has the additional benefits of increasing the depth of the depleted volume in the substrate and enhancing the ability to collect photon generated carriers that form deep in the substrate. If photon generated carriers produced by long wavelength photons form far enough away from the top plate 30 of FIG. 1, they may recombine before they are collected by the top plate 30. The depleted volume under the top plate is dependent on the substrate doping concentration and the bias applied to the top plate. For a given dopant concentration and bias limits that are predetermined by a wafer process, the depletion depth from the top plate of prior art 30, FIG. 1 is fixed. The improved photogate of FIG. 2 increases the total capacitance of the photogate without increasing the top surface area and increases the depletion depth for improved collection efficiency without increased biasing potentials.

Figure 3:
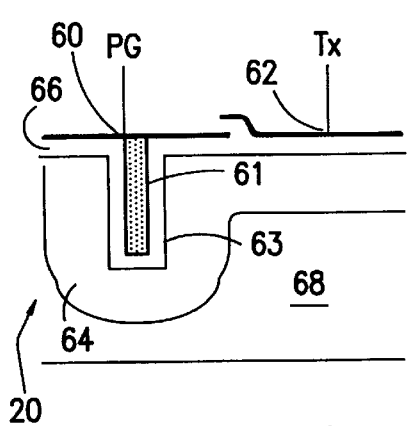
FIG. 3 is a cross-sectional view of the photogate of FIG. 2 taken along axis A.

FIG. 3 is a layout representative of the pixel 20 of FIG. 2. The Photo Gate 60 of FIG. 2 comprises a layer of polysilicon 60 poly 1 and the trench capacitor formed is electrode 61 by the area of poly 1 of FIG. 3. The Tx gate of FIG. 2 (#62) is illustrated in FIG. 3 as poly 2. Although not drawn to scale, the capacitance ratio of a trench capacitor to a surface planar capacitor, as illustrated by FIG. 3 can be 18 to 1. Trench capacitors according to the invention have an aspect ratio of about 1 to 6 through 1 to 8 for surface diameter to trench depth, depending on the particular process used to form the electrode. This increase in capacitance can be used to increase the exposed silicon surface area to collect photon generated charge (quantum efficiency) or to greatly shrink the size of a given pixel maintaining the same dynamic range or greatly increase the storage capacity (dynamic range) of the pixel. Whatever the trade off an engineer uses for a given pixel application, the depth at which a photon generated charge can be captured is increased for a given bias over prior art using a planar photogate.

Figure 4:
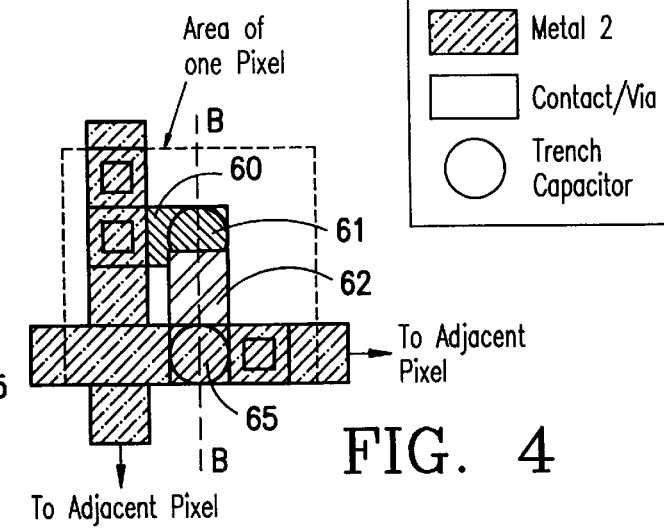
FIG. 4 is a diagram of a two capacitor passive pixel in accordance with this invention.

FIG. 4 shows a passive pixel according to this invention utilizing two trench capacitors to take advantage of any or all of the above listed attributes. Here the collection photo gate (P.G.) 60 and the transfer gate (T.G.) 62 include trench capacitors 61 and 65 respectively. This will allow either more storage capacity for greater dynamic range or a smaller surface area of the silicon being consumed by polysilicon for greater quantum efficiency (Q.E.). Trench capacitors 61 and 65 are used to collect change on 61 and then sense change on 65.

Figure 5:
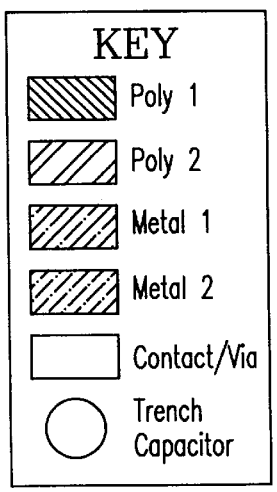
FIG. 5 is a cross-sectional view of the pixel of FIG. 4 taken along axis B.
Figure 5:
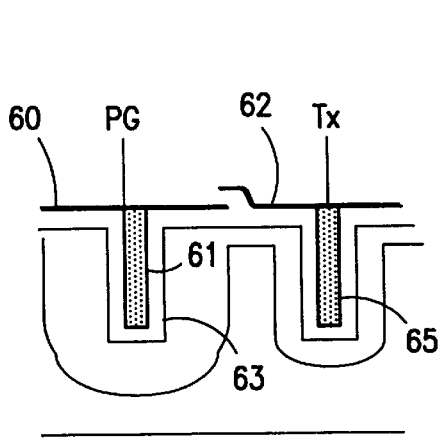

FIG. 5 is a potential layout for FIG. 4. There is more exposed silicon available to generate photon generated charge at all wavelengths. The transfer gate of FIG. 4 is composed of a second layer of polysilicon and a possible implementation of that pixel is shown here in FIG. 5. Notice how now there is more exposed silicon available to generate photon generated charge to all wavelengths; including, the shorter blue and ultra violet (U.V.) wavelengths. Notice how the dual trench configuration allows for more exposed silicon for enhanced quantum efficiency (Q.E.), while maintaining the same dynamic range.

Figure 6:
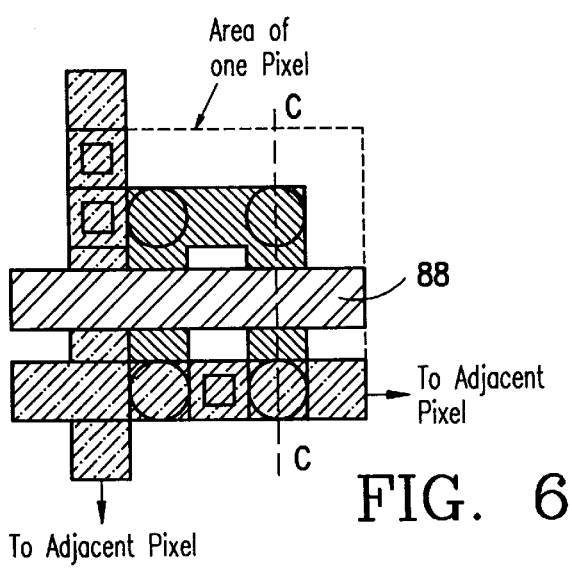
FIG. 6 is a diagram of a four capacitor passive in accordance with this invention.

FIG. 6 is another implementation of a quad trench capacitor with a transfer gate. This pixel design has another advantage if allowing the collection Photogate 1 (PG 1) and the Storage Photogate 2 (PG2) to be biased to the maximum that the process will allow. By operating both photogates at the maximum bias, the dynamic range of the pixel is doubled. Previous pixel designs illustrated in this patent allow only one of the photogates to operate at one half of the maximum operating bias the process will allow. The previous pixel designs are limited to collecting half the charge (q=CV) and therefore half the dynamic range. In this configuration the collection PG and what previously was the TX gate becomes an identical photo gate (PG2) that is electrically isolated by the transfer gate (TX).

Figure 7:
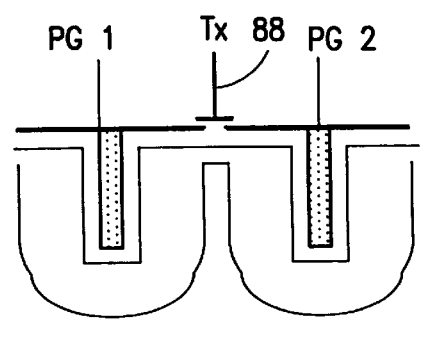
FIG. 7 is a cross-sectional view of the pixel of FIG. 6 taken along axis C.

FIG. 7 is a potential layout for FIG. 6. In this example layout, both photogates are comprised of two trench capacitors each. The photogates are isolated by the transfer gate. When photogate PG1 has been depleted and exposed for the proper length of time, photogate 2 is then depleted and transfer gate is also turned on (depleted). The potential of the first photogate PG1 is removed and all the collected charge is transferred into photo gate PG2. There are variations of operating the photogates in this example and previous ones, that can be done to enhance various characteristics like, nondestructive reading, signal storage, etc.

While the invention has been described in detail in connection with the presently preferred embodiments, there are modifications and variations of the photogate and trench capacitor that may be made without departing from the true spirit and scope of the invention.

What is claimed is:

1. A low voltage small area high signal to noise ratio comprising:
    a layer of photoreceptive semiconductor material having a surface;
    a conductive electrode extending from the surface, into the layer of semiconductor material for forming a potential well in the layer of semiconductor material upon the application of a voltage to the electrode;
    a layer of insulating material between the conductive electrode and the layer of semiconductor material; and
    a phototransmissive electrode on the layer of insulating material, overlaying the layer of photoreceptive semiconductor material and electrically connected to the conductive electrode.

2. The photoreceptor of claim 1 in which the conductive electrode comprises a phototransmissive material.

3. The photoreceptor of claim 1 in which the conductive electrode has an aspect ratio of between about 1 to 6 and about 1 to 8.

* * * * *